(12) United States Patent
Lai et al.

(10) Patent No.: US 10,734,231 B2
(45) Date of Patent: Aug. 4, 2020

(54) SYSTEMS AND METHODS FOR A TUNABLE ELECTROMAGNETIC FIELD APPARATUS TO IMPROVE DOPING UNIFORMITY

(71) Applicant: Taiwan Semiconductor Manufacturing Company, Ltd., Hsin-Chu (TW)

(72) Inventors: Chien-An Lai, Hsin-chu (TW); Joseph Wu, Hsin-Chu (TW); Wen-Yu Ku, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 16/234,793

(22) Filed: Dec. 28, 2018

(65) Prior Publication Data

US 2019/0139770 A1    May 9, 2019

Related U.S. Application Data

(62) Division of application No. 15/143,824, filed on May 2, 2016, now Pat. No. 10,170,313.

(51) Int. Cl.
| H01L 21/26 | (2006.01) |
| H01L 21/42 | (2006.01) |
| H01L 21/223 | (2006.01) |
| H01J 37/32 | (2006.01) |

(52) U.S. Cl.
CPC .... *H01L 21/2236* (2013.01); *H01J 37/32009* (2013.01); *H01J 37/3266* (2013.01); *H01J 37/32412* (2013.01); *H01J 37/32449* (2013.01); *H01J 37/32669* (2013.01); *H01J 37/32715* (2013.01)

(58) Field of Classification Search
None
See application file for complete search history.

(56) References Cited

U.S. PATENT DOCUMENTS

| 6,471,830 | B1 | 10/2002 | Moslehi et al. | |
| 6,673,199 | B1* | 1/2004 | Yamartino | H01J 37/321 118/723 E |
| 2001/0003271 | A1 | 6/2001 | Otsuki | |
| 2013/0240145 | A1* | 9/2013 | Nam | H01J 37/32082 156/345.28 |
| 2013/0273263 | A1* | 10/2013 | Xu | C23C 16/04 427/569 |
| 2015/0053563 | A1* | 2/2015 | Tsai | C25D 7/123 205/89 |
| 2016/0027613 | A1 | 1/2016 | Lane et al. | |

* cited by examiner

*Primary Examiner* — Calvin Y Choi
(74) *Attorney, Agent, or Firm* — Haynes and Boone, LLP

(57) ABSTRACT

A method includes receiving a semiconductor wafer into a chamber; generating a plasma within the chamber to accelerate particles toward the semiconductor wafer; generating a magnetic field above the semiconductor wafer by an electromagnetic structure contained within the chamber, wherein the electromagnetic structure comprises a plurality of electromagnetic elements; and adjusting the magnetic field, wherein the adjusting of the magnetic field includes moving positions of each of the plurality of electromagnetic elements independently.

20 Claims, 5 Drawing Sheets

SYSTEMS AND METHODS FOR A TUNABLE ELECTROMAGNETIC FIELD APPARATUS TO IMPROVE DOPING UNIFORMITY

PRIORITY

This is a divisional of U.S. application Ser. No. 15/143,824 filed on May 2, 2016, the entire disclosure of which is herein incorporated by reference.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

One broad category of commonly used techniques employed to form material layers and alter properties over semiconductor wafers is deposition, which includes the techniques such as chemical vapor deposition, physical vapor deposition, sputtering, ion implantation, etc. In many kinds of deposition, a plasma is used to accelerate ions or other particulars toward the surface of a wafer undergoing the deposition process. For example, in sputtering an ion of a noble gas may be used to facilitate forceful collisions with a target. Atoms of the target are knocked free by the colliding ions and then condense on the exposed surface of a semiconductor wafer forming a thin layer or film of the target material. In an ion implantation process, the ions may be distributed in a plasma generated above the surface of the wafer. The ions may then be accelerated toward the wafer by the manipulation of a charge or power applied to the wafer or to a wafer support device.

Particularly as the size of wafers used in the semiconductor integrated circuit industry has increased, existing techniques have been found to be unsatisfactory in terms of producing a uniform layer on the semiconductor wafer.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features, whether on the devices or the wafers and semiconductor features described herein, may be arbitrarily increased or reduced for clarity of discussion.

Figure 1:
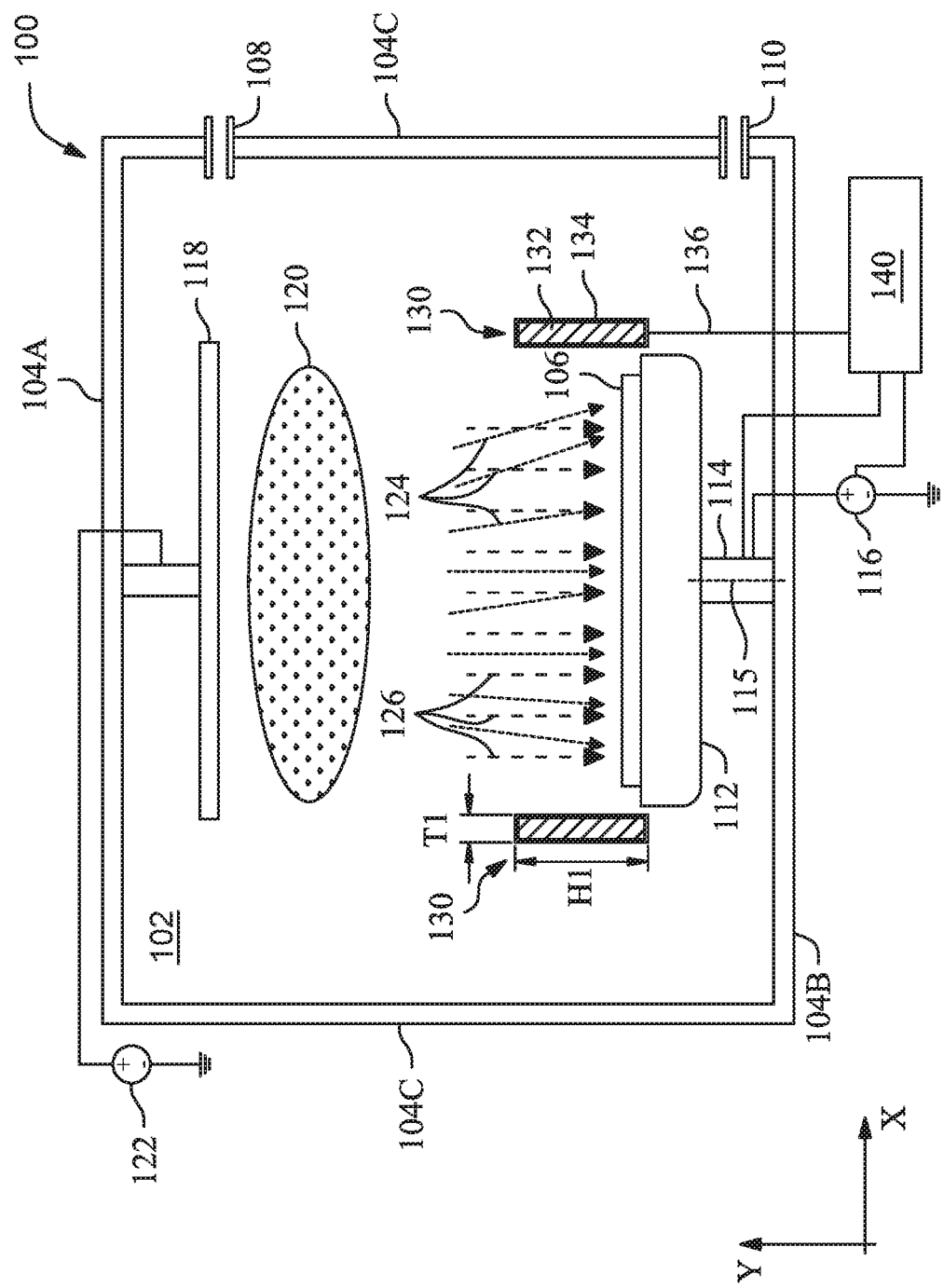
FIG. 1 is a cross-sectional view of an embodiment of a doping chamber according to aspects of the present disclosure.

These figures will be better understood by reference to the following detailed description.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

It is understood that several processing operations and/or features of a device may be only briefly described, some such operations and/or features being known to those of ordinary skill in the art. Also, additional processing steps or features can be added and certain of the following processing steps or features can be removed and/or changed while still implementing the claims. Thus, the following description should be understood to represent examples only, and are not intended to suggest that one or more steps or features is required in every embodiment.

It is further understood that the present disclosure refers generally to improving deposition uniformity by use of a tunable electromagnetic field structure proximate the wafer. More particularly, the present disclosure refers to improving doping uniformity in a plasma doping process. The wafers and substrates described herein may take various forms including but not limited to wafers (or portions thereof) or substrates of individual devices such as chips (e.g., fabricated on a wafer). Various features may be formed on the substrate by the addition, subtraction, and alteration of material layers formed on the substrate to produce integrated circuits including those formed by CMOS-based processes, MEMS devices, image sensors, and the like. Furthermore, as described above, specific embodiments may be described herein which are exemplary only and not intended to be limiting. For example, embodiments that refer to a substrate being a MEMS substrate, a CMOS substrate, or the like are exemplary only and not intended to limit the disclosure to any particular technology. A substrate including a semiconductor device, an integrated circuit (or portion thereof), designed and formed by CMOS-based processes may be referred to herein as a CMOS substrate. A substrate including a MEMS device may be referred to herein as a MEMS substrate. A MEMS device may include a variety of structures or elements operable for mechanical movement. The structures and arrangement thereof depend on the desired functionality of the device. In an embodiment, a MEMS device may be fabricated using typical processes of a CMOS fabrication process, including, for example, photolithography, etching processes, deposition processes including dopant deposition or implantation, plating processes, and other suitable processes.

Referring now to FIG. 1, the illustrated semiconductor manufacturing system 100 includes a dopant chamber 102 is shown therein. The dopant chamber 102 may sometimes be referred to as a deposition chamber 102, such as in embodiments in which the material deposited is a semiconductor dopant. The chamber 102 includes an upper wall 104A, a lower wall 104B, and sidewalls 104C. The upper wall 104A, the lower wall 104B, and the sidewalls 104C may be referred to collectively as the walls 104, such that a reference to the walls 104 may be a reference to any of the upper wall 104A, the lower wall 104B, and the sidewalls 104C or combinations thereof. The system includes mechanisms whereby at least one of the walls may be moved to provide access to the inside of the chamber 102 so that a wafer 106 may be inserted into or extracted from the chamber 102. In some embodiments, the system 100 may be a component of a larger device fabrication system that includes multiple chambers associated with multiple semiconductor processes and/or tools. The system 100 may also be referred to as a deposition tool, a dopant tool, or simply a tool.

The walls 104 may include a plurality of openings to permit the functioning of various aspects of the system 100. As noted, at least one opening (not expressly illustrated in FIG. 1) may permit wafers to be introduced into, and removed from, the chamber 102. Another opening in the walls 104, an inlet 108, may permit a gas, such as a reactive gas, to be introduced through the walls 104 into the chamber 102. An outlet 110 may be connected to a vacuum system so that a vacuum may be generated within the chamber 102 to control a pressure within the chamber 102 and/or to remove exhaust gases. The inlet 108 and the outlet 110 may be controlled by a control system 140 which may also communicate with the gas source and the vacuum system to control the introduction of one or more gases into the chamber 102 and the exhausting of those gases and/or waste gases from the chamber 102 to maintain the desired vacuum pressure level within the chamber 102.

Within the chamber 102, there may be a wafer support structure 112 providing a horizontal surface to interface with and secure the wafer 106 during a deposition process performed within the chamber 102, such as a plasma doping process. As illustrated in FIG. 1, a diameter of the wafer 106 is less than a diameter of the wafer support structure 112. In some embodiments, the diameter of the wafer 106 may be greater than the diameter of the wafer support structure 112. The wafer support structure 112 may be a vacuum chuck or an electrostatic chuck that can be activated to secure the wafer 106 in position during a deposition process and deactivated after termination of the process to permit removal of the wafer 106 from the chamber 102.

The wafer support structure 112 may be coupled to a shaft 114. The shaft 114 may be a mechanical device that can permit the wafer support structure 112, and the supported wafer 106 thereon, to be raised or lowered relative to the upper wall 104A and the lower wall 104B. The wafer support structure 112 may be made from a conductive material or may include a conductive element. The wafer support structure 112 may be coupled to a power supply 116. The power supply 116 may provide continuous DC power, high-voltage pulsed DC power, and/or AC power to the wafer support structure 112. The wafer support structure 112 may function as a cathode during a plasma doping process or other deposition process in which a dopant or other material is to be deposited on or into the wafer 106. For example, dopants may be deposited into the wafer 106 or into a semiconductor material layer disposed over the substrate of the wafer 106. As described herein, the wafer 106 may be a bare semiconductor substrate or may be a substrate with one or more material layers formed and/or patterned thereon prior to processing in the system 100. The wafer support structure 112 and/or the shaft 114 may be electrically insulated from the walls 104 of the chamber 102 by one or more insulated materials or material layers to prevent electrification of the walls 104.

The system 100 also includes a plasma generator 118 disposed within an upper area of the chamber 102. The plasma generator 118 is configured to generate a plasma 120 within the chamber 102 proximate the wafer 106. The plasma generator produces the plasma 120, which may include dopants or other materials, such as arsenic, boron, phosphorous, argon, oxygen, or other suitable materials that are to be deposited on or into the wafer 106. The plasma generator 118 may have a power supply 122 to provide the energy to generate and maintain the plasma 120 for a period of time. The power supply 122 may supply AC power, including RF power, and may provide a DC bias power as well.

The power supply 116 may be controlled by the control system 140 so as to attract material from the plasma 120, for example, by applying pulsed-DC power to the wafer support structure 112 or to an element included in the wafer support structure 112. Particles from the plasma 120 may travel along the dotted-line (or short dashed-line) paths 124 to the exposed upper surface of the wafer 106. The system 100 illustrated in FIG. 1 also includes an electromagnetic structure 130 that enables control over an electromagnetic field within the chamber 102 and over the surface of the wafer 106. The electromagnetic structure 130 may be also referred to as a magnetic field manipulation structure because it can be configured to alter the magnetic field proximate the wafer 106. As illustrated, the electromagnetic structure 130 includes a thickness T1 and a height H1. The thickness T1 may be less than the height H1 of the electromagnetic structure 130. For example, the thickness T1 may be in a range from about 3 cm to about 9 cm or more. The height H1 may be in a range from about 10 cm to about 17 cm or more. Other heights and thicknesses, both greater and lesser, are within the scope of the disclosure. The electromagnetic structure 130 produces a magnetic field that may increase distributional uniformity of the plasma particles as they travel to the exposed surface of the wafer 106. For example, the electromagnetic structure 130 may produce a magnetic field such that the particles traveling from the plasma 120 to the exposed surface of the wafer 106 follow the dashed line paths 126 rather than the paths 124. Consequently, the deposited particles may be distributed more uniformly across the surface of the wafer 106, which may result in more consistent performance of finished devices and better yields For example, when the particles are dopants being injected into a layer of the wafer 106, such as an upper portion of a semiconductor substrate, the distribution of the dopants in the layer may be more uniform because of the presence of the electromagnetic field produced by the electromagnetic structure 130. The electromagnetic field may direct the particles more uniformly by overriding an existing electromagnetic field within the chamber 102. For example, the electromagnetic field produced by the electromagnetic structure 130 may have a greater magnitude than an existing electromagnetic field, such as an existing electromagnetic field produced as part of the generation of the plasma 120.

Embodiments of the electromagnetic structure 130 may include a core structure 132 with one or more windings 134 around the core structure 132. As illustrated, in FIG. 1, two portions of the electromagnetic structure 130 are shown in cross-section. The two portions may be directly, physically coupled together such that a single core structure 132 provides both of the illustrated portions shown in FIG. 1. In some embodiments, the core structure 132 may be a magnetic core structure such as alnico (an alloy including cobalt, nickel, and iron) or a ferrite magnet, another ferrous material, or another magnetic material, while the windings 134 are provided by coils of insulated copper wire around the core structure 132. Accordingly, in some embodiments the core structure 132 may be a permanent magnet. In some embodiments, the core structure 132 includes a plurality of laminated plates formed into a curved-shape corresponding to the dimensions of the wafer 106. The windings 134 may wrap around the core structure 132 any number of times. For example, the windings 134 may wrap around the core structure 132 ten times, 20 times, or 50 times. In some embodiments, the windings 134 wraparound the core structure 132 hundreds or thousands of times. The windings 134 may be provided by a single wire 136 having both ends connected to a control system 140. The wire 136 may be an insulated copper wire or other conductive wire and may be wrapped around the core structure 132 or embedded in a series of loops within the core structure 132. For example, the core structure 132 may include a core with windings surrounding the core and additional core structure material surrounding the core and the windings. The additional core structure material may be different from the material of the core.

The control system 140 is configured to controllably adjust a current running through the wire 136 of the windings 134. Changes in the current running through the wire 136 and the windings 134 produce changes in the electromagnetic field produced by the electromagnetic structure 130, which may cause the particles for follow paths similar to paths 126 rather than paths similar to paths 124. The control system 140 may adjust the electric current running through the windings 134 to temporarily increase or decrease the magnetic field produced within the electromagnetic structure 130, i.e. between the cross-sectional portions of the electromagnetic structure 130 shown in FIG. 1. The increase or decrease provided by the electromagnetic structure 130 may have a duration range from multiple minutes (or longer where only the permanent magnetism of the core structure 132 is relied upon to adjust the magnetic field within the chamber 102) to fractions of a second. By adjusting the magnetic field produced in the central area of the electromagnetic structure 130, the particles of the plasma 120 may be directed along the paths 126 to produce a uniform layer on the surface of the wafer 106. The current running through the wire 136 may range from a value of about −120 amperes to about +120 amperes. Varying pulse widths and periods are included within the scope of this disclosure.

Figure 2:
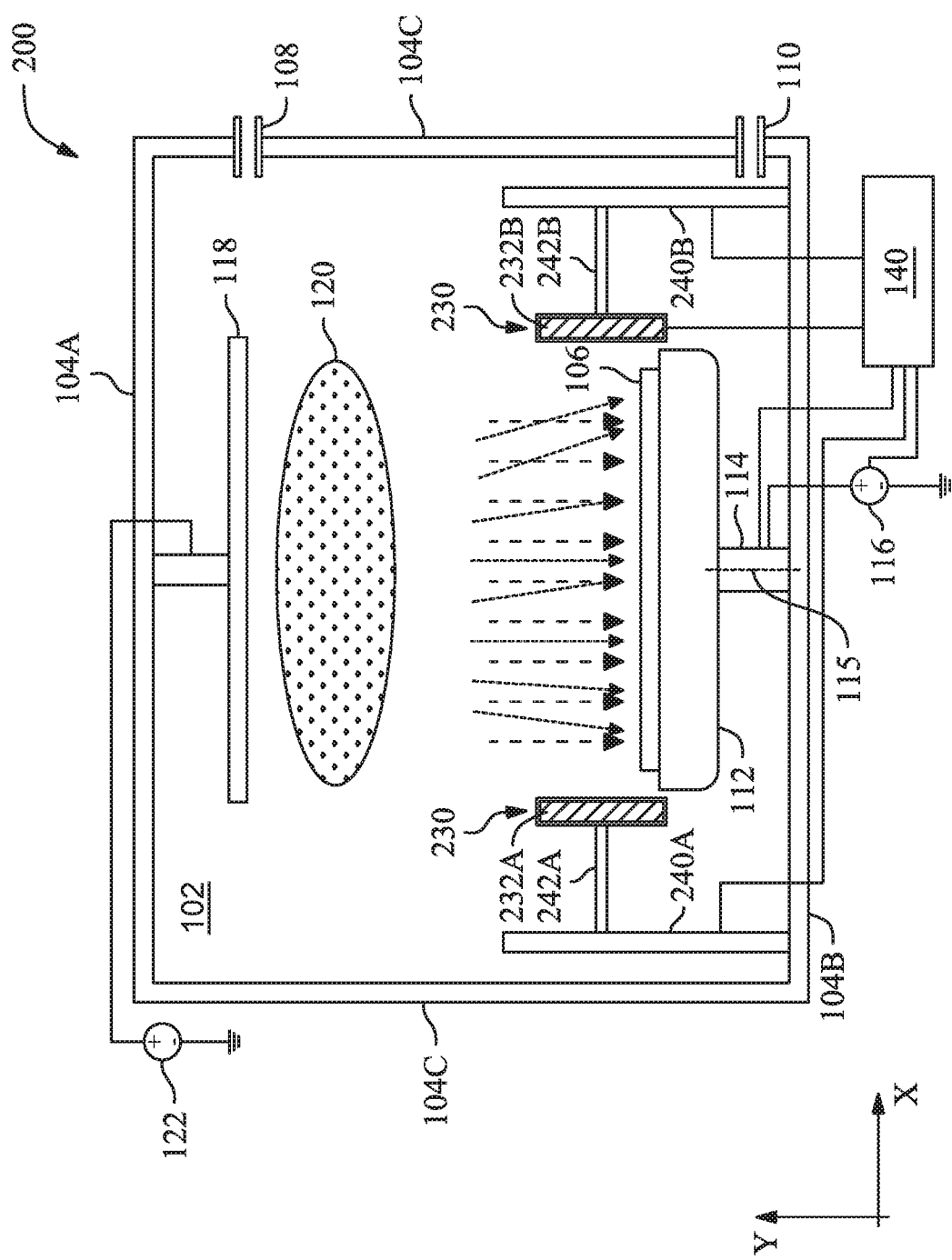
FIG. 2 is a cross-sectional view of another embodiment of a doping chamber according to aspects of the present disclosure.
Figure 3:
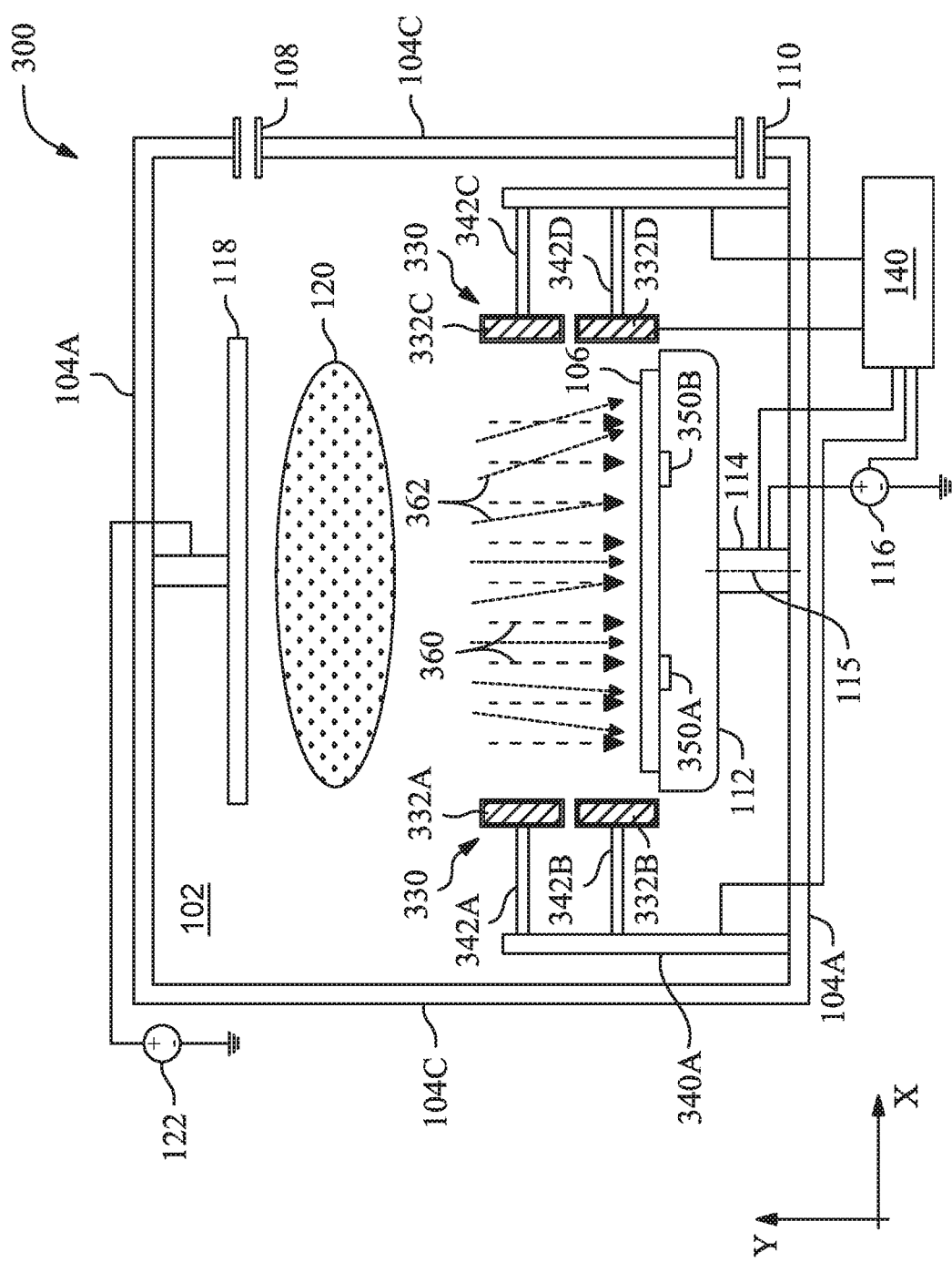
FIG. 3 is a cross-sectional view of an additional embodiment of a doping chamber according to aspects of the present disclosure.
Figures 4A, 4B, 4C:
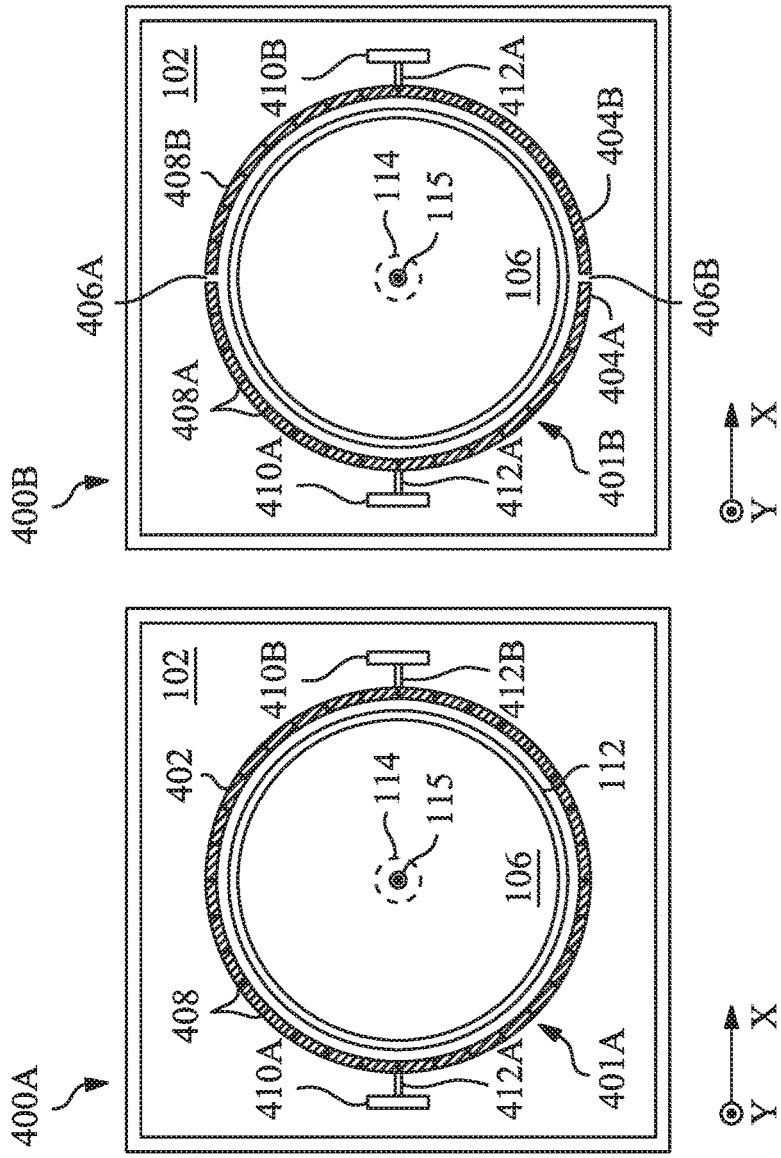
FIGS. 4A, 4B, and 4C are partially cross-sectioned top views of the doping chambers of any of FIGS. 1, 2, and 3 according to aspects of the present disclosure.

Variations of the electromagnetic structure 130 are included in cross-section in FIGS. 2 and 3 and in top view in FIGS. 4A, 4B, and 4C.

Referring now to FIG. 2, shown therein is a cross-sectional view of a semiconductor manufacturing system 200 that is similar in many respects to the system 100 of FIG. 1. As illustrated, the system 200 includes a chamber 102 defined between walls 104. The system 200 includes an inlet 108 and an exhaust or outlet 110 permitting gases to enter and exit the chamber 102. As illustrated in FIG. 2, a wafer 106 is supported by a wafer support structure 112 which is movable along a shaft 114 having a central axis 115, parallel to the y-axis of FIG. 1. A power supply 116 connects to the wafer support structure 112 through the shaft 114 the wafer support structure 112 may be positioned in a lower portion of the chamber 102. An upper portion of the chamber 102 may include a plasma generator 118 which generates a plasma 120. The plasma generator may be supplied with power by a power supply 122. The chamber 102 contains an electromagnetic structure 230. The electromagnetic structure 230 is disposed within the chamber 102 at a level that is lower within the chamber 102 than the electromagnetic structure 130 of FIG. 1. As illustrated, the lower edge of the electromagnetic structure 230 is positioned closer to the bottom wall 104B than the wafer 106 is. Accordingly, while the lower edge of the electromagnetic structure 230 is positioned closer to the bottom wall 104B than the wafer 106 is in some embodiments, the wafer 106 may be closer to the bottom wall 104B than the lower edge of the electromagnetic structure 230 is in other embodiments. As illustrated, the electromagnetic structure 230 may include two separate electromagnetic elements 232A and 232B, also referred to as magnetic field manipulation elements. The electromagnetic elements 232A and 232B may each have windings formed therearound. Windings 234A and 234B may repeatedly wrap around the elements 232A and 232B, respectively.

In some instances the lower edge of the electromagnetic structure 230 may be positioned at the level of the top surface of the wafer 106 or of the top surface of the wafer support structure 112. The position of the electromagnetic structure 230 relative to the wafer 106 may be adjusted by moving the electromagnetic structure 230 vertically along support structures 240A and 240B, referred to collectively as support structures 240. The electromagnetic structure 230, or individual elements thereof, may be coupled to each of the support structures 240A and 240B by support arms 242A and 242B, collectively referred to as support arms 242. Embodiments of the system 200 may include an electromagnetic structure 230 that is coupled to more than two support structures. For example, the system 200 may include four or more support structures like the support structures 240A and 240B. In some embodiments, the support structures 240A and 240B are communicatively coupled to the control system 140. Signals from the control system 140 may cause motors, servos, belts, or other mechanisms included in the support structures 240 to be activated so that the support arms 242 are raised or lowered relative to the bottom wall 104B, and thus relative to the wafer 106.

Accordingly, the system 200 may be mechanically adjustable in many respects: the wafer support structure 112 may be raised or lowered by the shaft 114, and the electromagnetic structure 230 may be raised or lowered by the support structures 240, i.e., may be moved along the y-axis. Additionally, the element or elements of the electromagnetic structure 230 may be adjusted rotationally or angularly. The mechanical adjustments of these features may cause differences in the electromagnetic field produced by the electromagnetic structure 230 above the wafer 106 to increase uniformity of particles from the plasma 120 that contact the surface of the wafer 106.

The support arms 242 may be fixed length structures in some embodiments; other embodiments of the system 200 include variable-length support arms 242 that may be controlled by the control system 140, permitting horizontal movement of the electromagnetic structure 230, i.e., movement along the x-axis or movement in a plane orthogonal to the y-axis. In some such embodiments, the electromagnetic structure 230 may be formed of multiple, separate electromagnetic elements that can be moved independently of each other. As is explained in greater detail below, the separate electromagnetic elements may be independently moved to increase uniformity of the electromagnetic field between the electromagnetic elements and above the wafer 106.

Referring now to FIG. 3, shown therein is a semiconductor manufacturing system 300 that is similar in many respects to the systems 200 and 100 of FIGS. 2 and 1 respectively. For example, like the systems 200 and 100, the system 300 includes a chamber 102 defined by an upper wall 104A, a lower wall 104B, and sidewalls 104C, referred to collectively as walls 104. The chamber 102 further includes a wafer support structure 112 that is movable along a shaft 114 and that supports the wafer 106, which is to undergo processing by a deposition process or a doping process. The system 300 includes a plasma generator 118 to generate a plasma 120 between the plasma generator 118 and the wafer support structure 112. The plasma generator 118 may serve as an anode while the wafer support structure 112 provides a cathode.

The chamber 102 of the system 300 includes an electromagnetic structure 330, which is similar in many respects to the electromagnetic structures 130 and 230 of FIGS. 1 and 2, respectively. Accordingly, the electromagnetic structure 330 may include one or more core structures, which may be magnetic, with windings around the core structures. As illustrated in cross-section in FIG. 3, the electromagnetic structure 330 includes four separate electromagnetic elements 332, with each individual electromagnetic element referred to as elements 332A, 332B, 332C, and 332D, respectively. The elements 332 may include core structures and have windings 334A, 334B, 334C, and 334D therearound. The elements 332 may be alnico magnets or made from another magnetic material such as a ferrous material. The windings may be provided by conductive wiring, such as copper wire as described elsewhere herein. While the elements 332 are illustrated in cross-section in FIG. 3, the elements 332 may have a circular shape as viewed from above. For example, the elements 332 may each have a half-circle shape or a quarter-circle shape as viewed from above, as can be understood by reference to FIGS. 4A, 4B, and 4C, described more specifically further below. As shown in FIG. 3, the elements 332A and 332C are positioned above the elements 332B and 332D in a stacked arrangement. The elements 332 in the stacked arrangement may be electrically isolated from one another.

As illustrated in FIG. 3, the electromagnetic elements 332 may be supported by support structures 340A and 340B, referred to collectively as support structures 340. The support structures 340 may include servos, belts, pulleys, motors, etc., in order to raise and lower the electromagnetic elements 332 as directed by the control system 140. The elements 332 may each be coupled to the support structures 340 by support arms 342A, 342B, 342C, and 342D. In embodiments in which each element 332 is separately coupled to the support structures 340, the elements 332 may be independently adjusted, i.e. raised or lowered or extended horizontally away from or toward the wafer 106. For example, the upper electromagnetic elements 332A and 332C may be raised relative to the wafer 106 and to the lower electromagnetic elements 332B and 332D, in order to increase uniformity of a magnetic field present between the electromagnetic elements 332A and 332C and between the electromagnetic elements 332B and 332D. In order to increase uniformity of the magnetic field above the wafer 106, the electromagnetic structure 330 may produce a non-uniform magnetic field to compensate for existing non-uniformity above the wafer 106. In some embodiments, multiple elements may be coupled to a support structure by a single support arm. For example, electromagnetic elements 332A and 332B may be coupled by single support arm to the support structure 340A. In such an embodiment, the electromagnetic elements 332A and 332B may be positionally adjusted relative to the wafer 106 while remaining in a fixed relationship relative to each other.

Some embodiments of the system 300, and the systems 200 and 100, may further include one or more magnetic field sensors disposed within the chamber 102 at various locations. For example, the illustrated embodiment of system 300 includes a first magnetic field sensor 350A and the second magnetic field sensor 350B, referred to collectively as magnetic field sensors 350. As illustrated, the magnetic field sensors 350 are embedded within the wafer support structure 112. In other embodiments, magnetic field sensors 350 may include more than two magnetic field sensors and may be disposed at multiple locations within the chamber 102, including above the electromagnetic structure 330 and below the electromagnetic structure 330. In some embodiments, the magnetic field sensors 350 or one of the magnetic field sensors 350 may be disposed in the area between the left (as seen in FIG. 3) electromagnetic elements 332A and 332B and the right (as seen in FIG. 3) electromagnetic elements 332C and 332D in order to more accurately measure the magnetic field in that area.

The magnetic field sensors 350 may be coupled to the control system 140 and may be included in feedback loops that adjust the current flowing through the windings 334 around the core structures of the electromagnetic elements 332. In other words, an output or outputs of the magnetic field sensors may be used as an input to a circuit or algorithm affecting the current. In some embodiments, each of the electromagnetic elements 332 is associated with a separate sensor of the magnetic field sensors 350 such that feedback may be provided individually for each of the electromagnetic elements 332. The magnetic field sensors 350 may be Hall effect sensors, magneto diodes, magneto transistors, magnetometers, Lorentz-force-based sensors, electron-tunneling based sensors, etc. Different types of sensors may be used at different positions within the chamber 102, and each sensor may be wired to communicate with the control system 140.

By including the electromagnetic structure 330 within the chamber 102 of the semiconductor manufacturing system 300, uniformity of particles deposited on or into the wafer 106 (i.e., into the substrate of the wafer 106 or into one or more material layers formed thereon) may be increased relative to a baseline uniformity in the absence of the electromagnetic structure 330. As illustrated in FIG. 3, the particles may move along the long dashed-line paths 360 rather than according to the less uniform, short dashed-line paths 362. While some embodiments of the electromagnetic structure 330 are passive, other embodiments may include active adjustments of the magnetic fields produced by the electromagnetic elements 332 during a deposition or doping process performed within the chamber 102.

Referring now to FIGS. 4A, 4B, and 4C, shown therein are alternative top views of semiconductor manufacturing systems like the semiconductor manufacturing systems 100, 200, and/or 300 of FIGS. 1, 2, and 3, respectively. The top views of FIGS. 4A, 4B, and 4C, are partially cross-sectioned views of a semiconductor manufacturing system 400A, 400B, and 400C, referred to collectively as systems 400. The systems 400 share many of the features described herein with respect to the systems 100, 200, and/or 300. For example, the systems 400 each include a chamber 102. A wafer 106 is shown on a wafer support structure 112 in each of FIGS. 4A, 4B, and 4C. The wafer 106 of each of the systems 400 is surrounded by an electromagnetic structure that alters the magnetic field over the wafer 106 to increase the uniformity of material layers produced by the systems 400. As illustrated in FIGS. 4A, 4B, and 4C the walls 104 of the systems 400 form a rectangular shape. Other embodiments of the walls 104 may, as viewed from above, have a circular shape, an ovoid shape, a hexagonal shape, an octagonal shape, or another shape.

As illustrated in FIG. 4A, the electromagnetic structure 401A of system 400A may include a single electromagnetic element or may include multiple electromagnetic elements in a stacked arrangement, such as the stacked arrangement shown in FIG. 3. The electromagnetic element or elements of the electromagnetic structure 401A may be an annular or frustocylindrical core element 402 formed from a solid material, such as a ferrous metal. The electromagnetic structure 401A may include a permanent magnet as the core element 402. The electromagnetic structure 401A may further include windings 408 around the core element 402. The windings may be a metal wire such as insulated copper wire, looped around the core structure any number of times. As described herein, the windings 408 are connected to a control system, such as the control system 140 of systems 100, 200, or 300, that may vary a current running through the windings 408 to adjust a magnetic field produced inside the inner wall of the core element 402. While the core element 402 is depicted as a closed cylindrical wall, a gap may be present in the core element 402 such that the cylindrical wall thereof is not closed.

Referring now to FIG. 4B, shown therein is an electromagnetic structure 401B that includes a first core element 404A and a second core element 404B, collectively referred to as the core elements 404 of the electromagnetic structure 401B. The core elements 404 are separated by a gap 406A and a gap 406B. Where the core elements 404 are permanent magnets, the ends of the core elements 404 may be aligned such that a north magnetic pole of the core element 404A is separated from the south magnetic pole of the core element 404B by the gap 406B. Similarly, the north magnetic pole of the core element 404B may be separated from the south magnetic pole of the core element 404A by the gap 406A. The magnetic poles of the core elements 404 may be aligned to provide for a more uniform magnetic field. Because the core elements 404A and 404B are separate from each other, the core elements 404A and 404B may be independently raised or lowered or moved away from the wafer 106 or closer to the wafer 106 by control of the support structures 410A and 410B and the support arms 412A and 412B user. Thus, while in some embodiments, the core elements 404 are fixed in position within the chamber 102; other embodiments permit positional adjustment of the core elements 404, either as a group or individually. Similarly, the windings 408A of the core element 404A are separate from the windings 408B of the core element 404B. The windings 408A and 408B may be controlled separately, such that a greater or lesser current flows through one of the windings 408A and 408B than the other and/or the frequency, duty cycle, or periodicity of current pulses may be different between the windings 408A and 408B.

Referring now to FIG. 4C, shown therein is an electromagnetic structure 401C that includes four core elements, labeled as core elements 404A, 404B, 404C, and 404D, respectively, and collectively referred to as core elements 404. Each of the core elements 404 has windings 408A, 408B, 408C, and 408D, respectively. The windings 408 may each be coupled to the control system 140, which may control currents flowing therethrough in terms of amperage, periodicity, duty cycle, etc. The currents in the windings 408 may be controlled by the control system 140 independently in some embodiments. Also shown in FIG. 4C, each of the core elements 404A, 404B, 404C and 404D may be coupled to a support structure 410A, 410B, 410C, and 410D, respectively. The core elements 404 may be coupled to the support structures 410 by support arms 412A, 412B, 412C, and 412D, respectively. As described herein, the support structures 410 and/or the support arms 412 may include servos, belts, or other mechanisms whereby the position of a coupled core element may be adjusted. For example, the control system 140 may adjust the support structures 410 and the support arms 412 to independently adjust the positions of each of the core elements 404 relative to the wafer 106. In some embodiments, the support structures 410 may be configured to rotate, under the control of the control system 140, around the central axis 115 of the shaft 114 to rotate the elements 404 around the wafer 106. In some embodiments, the shaft 114 may be configured to rotate the wafer support structure 112 relative to the support structures 410.

Each of the electromagnetic structures 401A, 401B, and 401C may be a stacked electromagnetic structure like the electromagnetic structure 320 shown in FIG. 3. Accordingly for example, the electromagnetic structure 401A may include multiple electromagnetic elements that are each like the electromagnetic core element 402. Similarly, the electromagnetic structure 401C may include 8 or more electromagnetic elements 404. In some embodiments that include a stacked electromagnetic structure, the support structures 410A and/or the support arms 412 may be actuatable independently of each other to move coupled electromagnetic elements 404 to adjust the magnetic field above the upper surface of the wafer 106. As described herein, a plurality of magnetic field sensors, such as the magnetic field sensors 350 of FIG. 3 may be positioned in different locations within the chamber 102 in order to observe in real time the magnetic field above the wafer 106. The information obtained from the magnetic field sensors may be used to adjust aspects of the current flowing through the windings around the core elements disposed within the chamber 102. In some embodiments, wafer-level maps of previously processed wafers may be used as an input to the control system 140. The wafer-level maps may indicate uniformity, or lack thereof, produced by the semiconductor manufacturing system in the absence of any electromagnetic structure like those described herein. For example, the wafer-level maps may provide a deposited layer thickness, a dopant profile, a resistivity, or other value for any given position on the wafer. The control system 140 may calculate a desired correction to the magnetic field based on the wafer-level map or maps and may further calculate mechanical positions and electrical currents of the electromagnetic structure to improve the uniformity of subsequently processed wafers.

Figure 5:
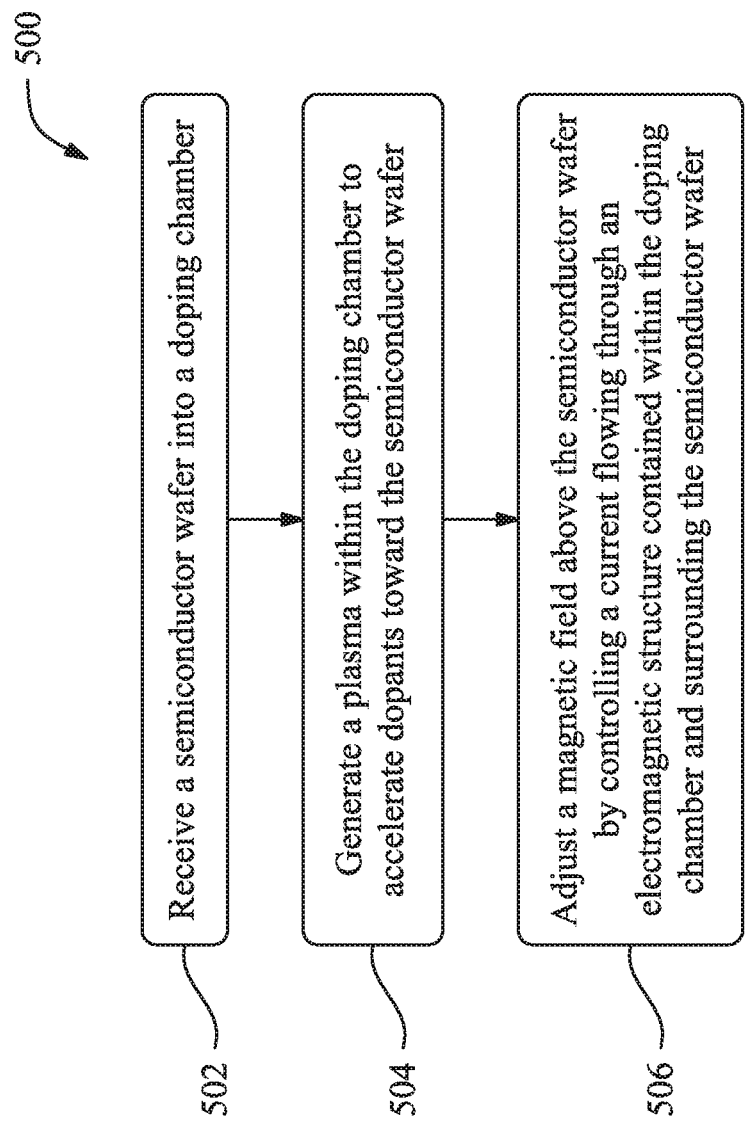
FIG. 5 is a flowchart of an embodiment of a method of depositing a material onto or into a semiconductor wafer according to aspects of the present disclosure.

Referring now to FIG. 5, shown therein is a method 500 for improving a deposition uniformity or doping uniformity in a semiconductor manufacturing system, like the semiconductor manufacturing systems shown in FIGS. 1, 2, 3, 4A, 4B, and 4C and described herein. Method 500 is illustrated in FIG. 5 as a flowchart including several enumerated operations. Embodiments of the method 500 may include additional or alternative operations before, after, in between, or as part of the enumerated operations. Some embodiments of the method 500 may include instructions executable by one or more processors, such as by a processor of the control system 140, that covers the processors to perform one or more of the operations illustrated in FIG. 5. The instructions may be stored in a non-transitory, tangible storage medium such as a CD-ROM, flash memory, a hard drive, or another suitable storage medium.

As illustrated in FIG. 5, the method 500 may begin at 502 when a semiconductor wafer is received into a doping chamber. For example, the wafer 106 may be received into the chamber 102 according to any of FIGS. 1, 2, 3, 4A, 4B, and 4C. In some embodiments, receiving the wafer 106 into the chamber 102 may include activating, by the control system 140, support structures and/or support arms to move electromagnetic elements away from or toward the wafer support structure 112 in order to improve access for a human operator or for a wafer insertion tool that may move wafers from a carrier and positioned them on the wafer support structure 112 without real-time human intervention. In some embodiments, the angle of the electromagnetic elements with respect to the bottom wall 104B of the chamber 102 may be adjusted as part of the receiving operations. During the receiving operation, no current may be flowing through the windings of the electromagnetic structure disposed within the chamber 102.

At 504, a plasma is generated within the doping chamber to isolate and accelerate dopants toward the semiconductor wafer. For an example referring to semiconductor manufacturing system 200 of FIG. 2, the plasma 120 may be generated by the plasma generator 118, which is coupled to the power supply 122, which may be coupled to and controlled by the control system 140. The plasma 120 may include particles, such as ions to be deposited on the surface of the wafer 106. For example, the particles may be dopant ions such as boron, phosphorus, arsenic, and/or other dopants. The dopant ions may be accelerated toward the wafer support structure 112 by a charge or voltage applied thereto. For example, a negative voltage ranging from about 500 V to multiple kV may be applied in order to accelerate the ions toward the wafer 106 such that the ions penetrate into the wafer 106. The ions may penetrate into a substrate of the wafer 106 or into a material layer thereon. As part of the plasma generation operation, the pressure within the chamber 102 may be carefully controlled by control of the inlet 108 and the outlet 110. For example, the pressure within the chamber 102 may be maintained in a range of about 1 mTorr to about 100 mTorr. Other voltages, including positive voltages may be used in some embodiments to cause particles to be isolated and then accelerated toward the wafer 106.

At 506, a magnetic field above the semiconductor wafer may be adjusted by controlling a current flowing through an electromagnetic structure contained within the doping chamber and surrounding the semiconductor wafer. For an example referring to FIG. 4A, the electromagnetic structure 401A may be disposed within the chamber 102 and may encircle the wafer 106 and wafer support structure 112 as viewed from above in FIG. 4A. The electromagnetic structure 401A may have a solid core structure 402 that may be magnetized temporarily or permanently. A plurality of windings 408 may repeatedly encircle the core structure 402, with each winding increasing the magnetic field relative to a current flowing through a wire, such as a copper wire forming the windings 408. Accordingly, at least a portion of the magnetic field generated by the electromagnetic structure 401A may be an induced magnetic field, induced by the current through the windings 408. The magnetic field produced by the electromagnetic structure 401A, or any of the other electromagnetic structures described herein or embodiments thereof, may increase uniformity of the dopants on the wafer 106. The increased uniformity of the dopants on the wafer 106 may result in increased consistency from device to device fabricated on the wafer 106 and may improve device yields from the wafer 106.

In some embodiments, after 506 an annealing process may be performed in order to activate the ions or particles on or within the material layer of the wafer 106. Additional processing a beep subsequently performed in order to produce semiconductor devices, such as transistors, capacitors, memory structures, MEMS devices, and others.

Adjusting the magnetic field above the semiconductor wafer by controlling the current flowing through the electromagnetic structure may include performing adjustments to the position and/or orientation of the electromagnetic structure within the chamber 102. As described herein, embodiments of the electromagnetic structure may include one or more electromagnetic elements that may be jointly moved or individually moved horizontally, vertically, and/or rotationally within the chamber 102. For example, an electromagnetic structure may include the frustocylindrical electromagnetic core element 402 of FIG. 4A and the paired frustocylindrical electromagnetic elements 404A and 404B of FIG. 4B in a stacked arrangement such that the electromagnetic core element 402 is positioned above the electromagnetic elements 404A and 404B similar to the stacked configuration of the electromagnetic structure 320 of FIG. 3.

In addition or in the alternative, a current flowing through the windings 408 of the electromagnetic core element 402 may be adjusted in order to adjust an electromagnetic field produced thereby. For example, the current may be increased or decreased, thereby altering a magnitude of the magnetic field and/or direction thereof. In the above example in which the electromagnetic structure includes the electromagnetic core element 402 and the electromagnetic elements 404A and 404B in a stacked arrangement, the control system 140 may independently adjust currents flowing through the windings 408, 408A, and 408B in order to produce a desired magnetic field to increase uniformity of doping or deposition within the chamber 102.

Although some embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. Additionally, combinations of features from the disclosed embodiments are within the scope of the present disclosure. In the claims, means-plus-function clauses are intended to cover the structures described herein as performing the recited function and not only structural equivalents, but also equivalent structures.

Thus, the present disclosure provides systems, tools, and methods for improving dopant or deposition uniformity by utilizing a tunable electromagnetic field apparatus. In some embodiments, the provided system includes a chamber configured to contain a semiconductor wafer, a plasma generator, and a gas inlet, and an exhaust gas outlet. The gas inlet permits a controlled flow of a gas into the chamber through a wall of the chamber and the exhaust gas outlet permits exhausting of gas from the chamber. The system further includes a wafer support structure configured to support the semiconductor wafer during a doping or deposition process and an electromagnetic structure positioned within the chamber and at least partially surrounding an upper surface of the wafer support structure.

In some embodiments of the system, the electromagnetic structure includes a core structure encircled by windings of conductive wire. The core structure includes a magnetic material and the windings comprise copper wire. The windings are coupled to a control system configured to controllably vary a current flowing through the windings to alter the deposition process performed within the chamber. The system further includes one or more electromagnetic sensors disposed within the chamber to measure a magnetic field generated by the electromagnetic structure.

In yet other embodiments, a dopant tool or deposition tool is provided. Embodiments of the dopant tool include a chamber sized to contain a wafer, a plasma generator to accelerate particles toward a wafer support structure, and an electromagnetic structure disposed between the plasma generator and the wafer support structure. The electromagnetic structure at least partially encircles the wafer support structure. In some embodiments, the electromagnetic structure includes a first electromagnetic element and a second electromagnetic element, wherein the first and second electromagnetic elements are positioned opposite each other relative to a central axis of a shaft coupled to the wafer support structure. The first and second electromagnetic elements are separated by a first gap between the first ends of the first and second electromagnetic elements and by a second gap between the second ends of the first and second electromagnetic elements.

In yet other embodiments, a method is provided for improving the dopant uniformity in a semiconductor layer. Embodiments of the method include operations of receiving a semiconductor wafer into a doping chamber, generating a plasma within the doping chamber to accelerate dopants toward the semiconductor wafer, and adjusting a magnetic field above the semiconductor wafer by controlling a current flowing through an electromagnetic structure contained within the doping chamber and surrounding the semiconductor wafer. In some embodiments, the method includes monitoring adjustments to the magnetic field with at least one magnetic field sensor positioned within the doping chamber. In some embodiments, controlling the current flowing through the electromagnetic structure includes controlling each current passing through each of at least two electromagnetic elements.

What is claimed is:

1. A method comprising:
   receiving a semiconductor wafer into a chamber;
   generating a plasma within the chamber to accelerate particles toward the semiconductor wafer;
   generating a magnetic field above the semiconductor wafer by an electromagnetic structure contained within the chamber, wherein the electromagnetic structure comprises a plurality of electromagnetic elements; and
   adjusting the magnetic field, wherein the adjusting of the magnetic field includes moving positions of each of the plurality of electromagnetic elements independently.

2. The method of claim 1, wherein the moving of the positions includes moving horizontally or vertically with respect to the semiconductor wafer.

3. The method of claim 1, wherein the moving of the positions includes moving rotationally with respect to the semiconductor wafer.

4. The method of claim 1, further comprising:
   monitoring the magnetic field with a plurality of magnetic field sensors positioned within the chamber, thereby providing feedback to the adjusting of the magnetic field.

5. The method of claim 4, wherein at least one of the plurality of magnetic field sensors is positioned directly under the semiconductor wafer.

6. The method of claim 4, wherein each of the plurality of electromagnetic elements is individually associated with one of the plurality of magnetic field sensors.

7. The method of claim 1, wherein the adjusting of the magnetic field further includes controlling a current flowing through the electromagnetic structure.

8. The method of claim 7, wherein the controlling of the current includes changing the current's amplitude, duty cycle, or frequency.

9. The method of claim 1, further comprising:
   reading a wafer-level map, thereby calculating a target adjustment of the magnetic field from the wafer-level map.

10. The method of claim 9, wherein the wafer-level map is acquired from a previously processed wafer.

11. A semiconductor manufacturing method, comprising:
    securing a wafer on a wafer support structure;
    generating a plasma by a plasma generator positioned above the wafer support structure;
    generating a magnetic field above the wafer by an electromagnetic structure, wherein the electromagnetic structure comprises at least two electromagnetic elements;
    measuring the magnetic field by at least one magnetic field sensor; and
    adjusting the magnetic field, wherein the adjusting of the magnetic field includes adjusting each current flowing through each of the at least two electromagnetic elements independently, and wherein the adjusting of the magnetic field includes receiving measurements of the magnetic field from the at least one magnetic field sensor.

12. The method of claim 11, wherein the adjusting of each current includes changing each current's amplitude, duty cycle, or frequency.

13. The method of claim 11, wherein the adjusting of the magnetic field further includes changing physical locations of the electromagnetic structure.

14. The method of claim 13, wherein the changing of the physical locations includes moving each of the at least two electromagnetic elements independently.

15. The method of claim 11,
    wherein the at least one magnetic field sensor is positioned under the wafer support structure.

16. The method of claim 11, wherein the generating of the magnetic field includes flowing currents through the electromagnetic structure that is magnetized permanently.

17. The method of claim 11, wherein the generating of the magnetic field includes flowing currents through the electromagnetic structure that is magnetized temporarily.

18. A semiconductor manufacturing method, comprising:
    receiving a semiconductor wafer into a doping chamber;
    generating a plasma within the doping chamber to accelerate dopants toward the semiconductor wafer;
    generating a magnetic field above the semiconductor wafer by flowing a current through an electromagnetic structure positioned in the doping chamber; and
    adjusting physical locations of the electromagnetic structure to tune the magnetic field, thereby correcting a flying path of the dopants.

19. The method of claim 18, wherein the electromagnetic structure comprises at least two electromagnetic elements whose positions are movable independently of each other.

20. The method of claim 18, wherein the adjusting of the physical locations of the electromagnetic structure includes moving horizontally, vertically, or rotationally of the electromagnetic structure.

* * * * *